(12) United States Patent
Budai

(10) Patent No.: US 9,337,616 B2
(45) Date of Patent: May 10, 2016

(54) BIAS CURRENT CONTROL OF LASER DIODE INSTRUMENT TO REDUCE POWER CONSUMPTION OF THE INSTRUMENT

(71) Applicant: IXYS Corporation, Milpitas, CA (US)

(72) Inventor: James Budai, Fort Collins, CO (US)

(73) Assignee: IXYS Corporation, Milpitas, CA (US)

(*) Notice: Subject to any disclaimer, the term of this patent is extended or adjusted under 35 U.S.C. 154(b) by 32 days.

(21) Appl. No.: 14/320,238

(22) Filed: Jun. 30, 2014

(65) Prior Publication Data

US 2014/0314112 A1  Oct. 23, 2014

Related U.S. Application Data

(63) Continuation of application No. 12/814,213, filed on Jun. 11, 2010, now Pat. No. 8,787,415.

(51) Int. Cl.
   *H01S 3/00* (2006.01)
   *H01S 5/026* (2006.01)
   *H01S 5/042* (2006.01)
   *H01S 5/062* (2006.01)

(52) U.S. Cl.
   CPC ............ *H01S 5/0261* (2013.01); *H01S 5/0428* (2013.01); *H01S 5/06216* (2013.01)

(58) Field of Classification Search
   CPC . H01S 5/0261; H01S 5/06216; H01S 5/0428; H01S 5/042
   See application file for complete search history.

(56) References Cited

U.S. PATENT DOCUMENTS

| 3,478,280 | A  | 11/1969 | Fenner ........................... 372/26 |
| 4,998,257 | A  | 3/1991  | On et al. ................... 372/29.02 |
| 5,123,023 | A  | 6/1992  | Santarelli et al. .......... 372/38.02 |
| 5,444,728 | A  | 8/1995  | Thompson ................. 372/38.02 |
| 5,450,430 | A  | 9/1995  | Chung ........................... 372/38 |
| 6,697,402 | B2 | 2/2004  | Crawford ................... 372/38.03 |
| 7,124,592 | B2 | 10/2006 | Tanaka ........................... 62/3.2 |
| 7,512,166 | B2 | 3/2009  | Lyu et al. .................... 372/38.1 |
| 7,532,653 | B2 | 5/2009  | Anderson et al. .......... 372/38.07 |
| 8,508,258 | B2 | 8/2013  | Ishikawa et al. ............... 327/108 |
| 2006/0109389 | A1 | 5/2006 | Ichikawa et al. .................. 349/1 |
| 2007/0030785 | A1 | 2/2007 | Masui et al. ................. 369/59.13 |
| 2009/0296763 | A1 | 12/2009 | Inukai ........................ 372/38.02 |
| 2010/0074283 | A1 | 3/2010 | Ikegami .......................... 372/24 |
| 2011/0164891 | A1 | 7/2011 | Miyake ........................... 399/51 |

OTHER PUBLICATIONS

"IXYS Colorado Introduces PCS-9000 Series High Power Laser Diode Drivers", Business Wire, Apr. 15, 2010 (2 pages).

*Primary Examiner* — Jessica Stultz
*Assistant Examiner* — Delma R Forde
(74) *Attorney, Agent, or Firm* — Imperium Patent Works LLP

(57) ABSTRACT

Embodiments for driving a laser diode includes generating a bias current having a duty cycle that is less than 100%. The current level of the bias current is insufficient to turn on the laser diode. A drive current is generated and combined with the bias current to turn on the laser diode almost instantly.

20 Claims, 14 Drawing Sheets

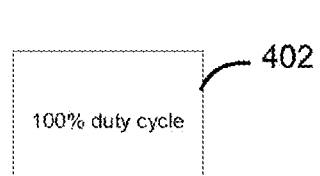
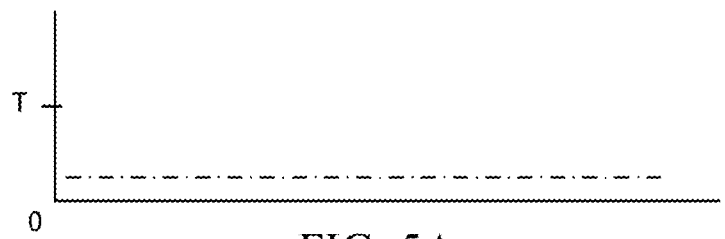
FIG. 5A
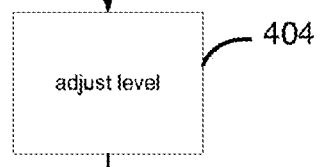
FIG. 5B
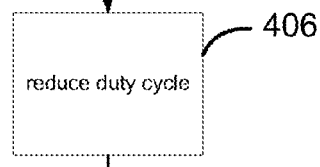
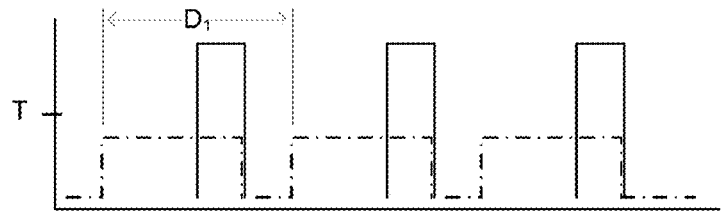
FIG. 5C
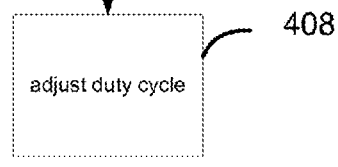
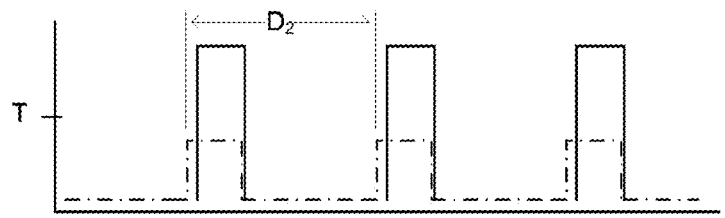
FIG. 5D
FIG. 4
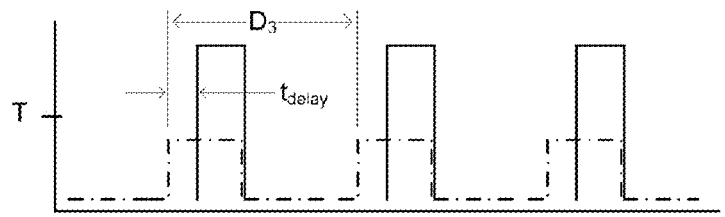
FIG. 5E

| PARAMETER | VALUE |
|---|---|
| PULSE OUTPUT CURRENT | |
| Amplitude | 150 to 600A (+25Amps - 0Amps)   PCX-3600 |
| | 100 to 400A (+25Amps - 0Amps)   PCX-8400 |
| | 50 to 200A (+25Amps - 0Amps)   PCX-8200 |
| Means Of Adjustment | Graphical User Interface / Computer Control |
| Output Polarity | Positive |
| Pulse Width | Adjustable width that is defined by input 'TRIGGER' Pulse Width. |
| | Acceptable Pulse Width >=75nSec |
| Bias Pulse Width | Adjustable width that is defined by input 'BIAS' Pulse Width logically ORed with the input 'TRIGGER' Pulse Width. |
| | Acceptable Pulse Width >= 75nSec |
| Pulse Rise Time | Fixed rise time < 100 nSec |
| | (output transition from 10% to 90% of peak current) |
| Pulse Fall Time | Fixed fall time <= 5 uSec |
| | (output transition from 90% to 10% of peak current) |
| External Pulse Recurrence Frequency Range | External Trigger <= 100kHz |
| Internal Pulse Recurrence Frequency Range | 2000 Hz to 25kHz |
| Maximum Duty Cycle | Limited by Maximum Power Output |
| | Duty Cycle maximum = ( (100%)² X ) / ( (24V)²(Bias Current + Pulse Current) ) |
| | X=1200 Watts for internal power supply |
| | X=3700 Watts for external power supply |
| Maximum Output Power | 1700 Watts Maximum with internal power supply.   AC Voltage = [100 ... 264] |
| | 3700 Watts Maximum with external supply. |
| External Trigger to Output Pulse delay | < 250nSec |

FIG. 10A

| | |
|---|---|
| Output Pulse Ripple/Droop | <=5% of output current |
| Skew<br><br>From trigger (internal or external) to the output pulse | Pulse to pulse stability <=5nSec |
| Output Connector | DEI Cable Assembly Part Number 8100-0007 |
| DRIVE FORWARD VOLTAGE | |
| Vf | 24V with internal power supply<br><br>( Input DC Voltage – 4V ) with external power supply |
| INPUT SIGNALS | |
| TRIGGER Input | 0 to 5V. High = Output to Load Low = No Output to Load<br><br>PCB-Mounted BNC |
| BIAS Input | 0 to 5V. High = Output to Load Low = No Output to Load<br><br>PCB-Mounted BNC |
| Type | Positive Level Trigger, 75nS minimum pulse width |
| Termination | 50 Ohms / 10k Ohm Ohms |
| Input Voltage Levels | 0 to 5V |
| OUTPUT SIGNALS | |
| SYNC Output<br><br>See Note 1 | 50 Ohm output impedance. 0 – 5V |
| IMON Output | 0 to ~550mV into 1M ohm load. (Corresponds to 0 – 600 Amp output)<br><br>1 Amp Output Current = ~0.98mV on IMON output |
| VMON | 0 – 50V into 1M ohm load. (Corresponds to 0 – 200 Volts on Output)<br><br>100 Volts on the Output = 25.5 Volts on VMON output |
| SAFETY CONTROLS | |
| Front Key Switch | This switch enables/disables the output of the system. |
| Output connector interlock magnetic switch | Without the output connector in place the output of the system is disabled. |
| REAR INTERLOCK signal | BNC connector<br><br>Normal operation : Shorted Shield to Center Conductor<br><br>Fault Condition : Shield not connected to center conductor (open) |

FIG. 10B

BIAS CURRENT CONTROL OF LASER DIODE INSTRUMENT TO REDUCE POWER CONSUMPTION OF THE INSTRUMENT

CROSS REFERENCE TO RELATED APPLICATION

This application is a continuation of, and claims priority under 35 U.S.C. §120 from, nonprovisional U.S. patent application Ser. No. 12/814,213 entitled "Bias Current Control Of Laser Diode Instrument To Reduce Power Consumption Of The Instrument," filed on Jun. 11, 2010, now U.S. Pat. No. 8,787,415. The entire subject matter of patent application Ser. No. 12/814,213 is incorporated herein by reference.

BACKGROUND OF THE INVENTION

The present invention relates to a laser diode driver, and more particularly to the bias current control of the output to reduce the overall power consumption of the driver, interconnects and laser diode (sometimes referred to as "diode laser").

It is well known in the laser diode arts that the drive current applied to a laser diode must exceed a certain threshold current level before the laser diode will emit laser light; i.e., the laser diode turns on. If the amount of current that is driving the laser diode is below this threshold level, then the laser diode remains dark.

In order to turn on laser diodes quickly, the diodes are normally driven by a bias current. Conventionally operated laser diode drivers provide a bias current that is applied to (i.e., drives) the laser diode at a non-zero current level that is insufficient to turn the laser on (i.e., less than the turn-on threshold current). Conventionally, this bias current is a constant DC level and can be anywhere from a few milliamps to several Amps. When a main output current (the drive current) is applied to the laser diode, the laser diode can turn on much more quickly than if the laser diode was not being driven by a bias current. The laser diode can be made to turn on nearly instantly by properly setting the DC level of the bias current close to the turn-on threshold current level. It is common practice for the user to find a suitable DC level for the bias current by straightforward trial and error, since laser diode characteristics, such as the threshold level, typically vary from manufacturer to manufacturer.

The turn-on threshold current level is known in the laser diode industry as "the bias current" or "the simmer current." However, in order to distinguish the actual current that is applied to the laser diode versus the current level above which the laser diode turns on, the latter will be referred to herein variously as "turn-on current level," "turn-on threshold current level," and so on. The actual current that is applied to the laser diode will be referred to as the bias current.

The typical operation of a laser diode driver instrument is shown by the graph in FIG. 13. The x-axis is time (milliseconds). The left-side y-axis is current (Amps) and the right-side y-axis is light output (Watts). FIG. 13 shows a trace for the output current of the instrument consisting of a bias current level and the drive current. FIG. 13 shows the instrument is configured to output a constant current of 25 Amps (the bias current) and to output a current of 95 Amps (the drive current). The light output of the laser diode (expressed in units of Watts) is shown as a trace that is superimposed on the trace of the output current of the instrument.

When the output current of the instrument consists only of the bias current (e.g., at the time between 0 and 20 mSec), the laser diode emits no light, even though it is being driven by the bias current. When the drive current is added to the bias current, then the laser diode emits light; i.e., it is turned on.

Moreover, by virtue of driving the laser diode with a bias current prior to applying the drive current, the laser light turns on almost immediately as shown by the steep (step function-like) profile of the light output trace. If the laser diode is not pre-driven by a bias current, the light output trace of the laser diode would have more of a triangular profile (for example, see the inset in FIG. 13), as the laser slowly turns on and off. Many applications require a sharp, instant-on type of laser burst. For example, when doing distance measurements, the user wants a bright laser burst and then for the laser to turn off. For such applications, the use of a bias current is an important part of laser diode operation.

Lower bias current levels do not use very much power, but the light profile that results by operating the laser diode with a lower bias current may not be adequate. However, as the bias current level is increased to a suitable level, the laser diode driver instrument and overall laser system will consume more power. Accordingly, a user will adjust the bias current level to as low a level as possible while still achieving a suitable immediate turn-on behavior from the laser diode. Lower bias current levels do not use very much power, but the light profile that results by operating the laser diode with a lower bias current may not be adequate. However, as the bias current level is increased to a suitable level, the laser diode driver instrument and overall laser system will consume more power. Accordingly, a user will adjust the bias current level to as low a level as possible while still achieving a suitable immediate turn-on behavior from the laser diode.

BRIEF SUMMARY OF THE INVENTION

In embodiments of the present invention, a laser diode driver can be controlled to produce a pulsed bias current. In embodiments, the duty cycle can be in the range >0% duty cycle to <100% duty cycle. In embodiments, the duty cycle can be 100%.

Since laser diodes have different bias current levels and operation characteristics, the bias duty cycle of a pulsed bias current can be modified by the end user on a case by case basis. In embodiments, a user can externally trigger the bias pulse. In embodiments, the duty cycle of the externally triggered pulsed bias current can be in the range >0% duty cycle to <100% duty cycle. In embodiments, the duty cycle of the externally triggered pulsed bias current can be 100%.

BRIEF DESCRIPTION OF THE DRAWINGS

FIG. 4 illustrates a calibration procedure in accordance with embodiments of the present invention.
FIGS. 5A-5E illustrate waveforms corresponding to a calibration procedure.
FIGS. 10A and 10B are operational specifications of an embodiment of the PCX-9000 series instrument.

DETAILED DESCRIPTION

Figure 1:
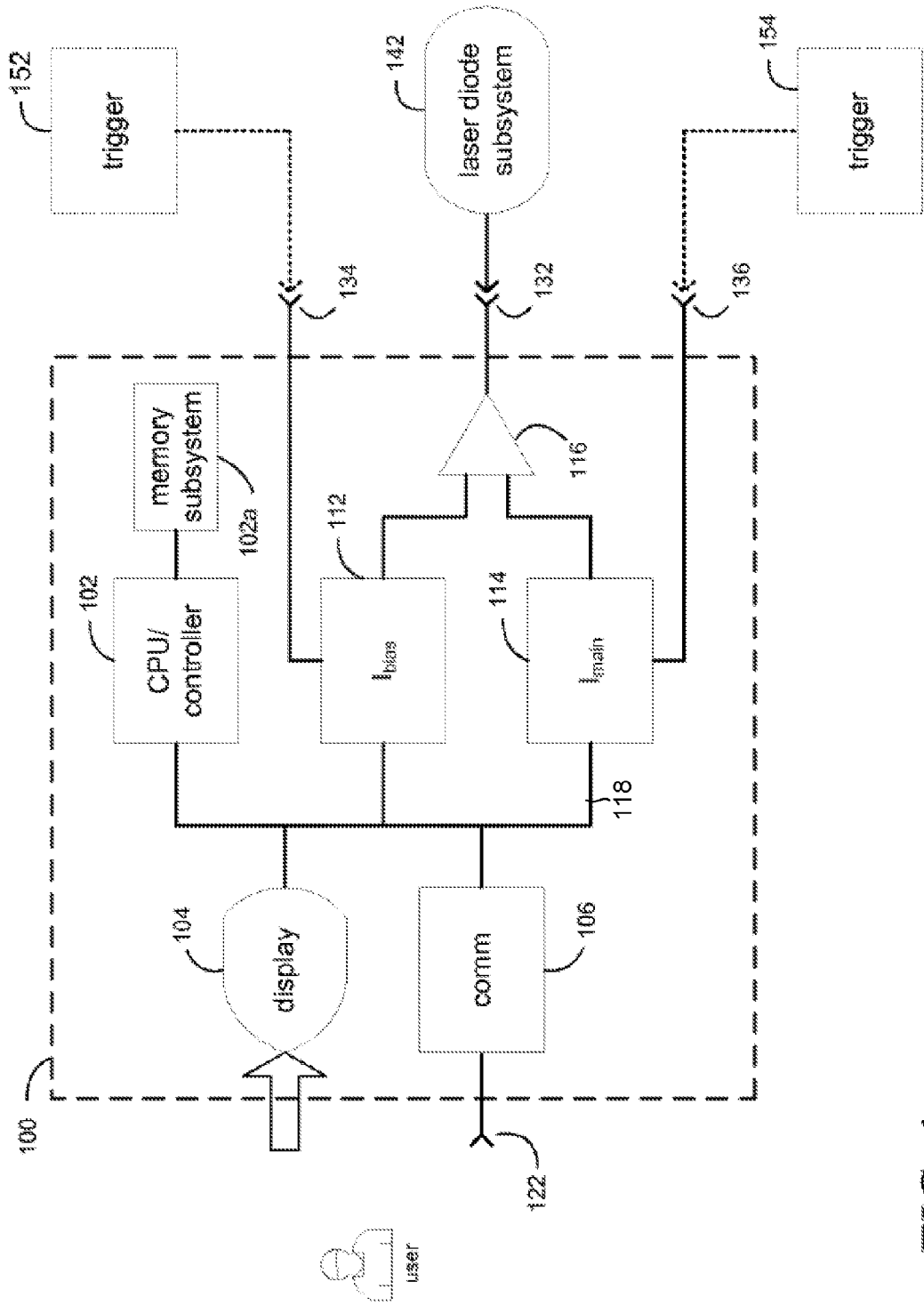
FIG. 1 illustrates an embodiment of the present invention.

In an embodiment of the present invention as shown in FIG. 1, a laser diode driver 100 can be used as an instrument to drive a laser diode 142 with a drive current generated by the laser diode driver. In embodiments, the laser diode 142 may be a laser diode array, or a laser diode bar, or other similar laser diode components.

In an embodiment, the laser diode drive 100 may include a controller 102. The controller 102 may be provided via a suitably programmed CPU (central processing unit) or microcontroller. In an embodiment, the controller 102 may be provided in a PLD (programmable logic device), or some suitable combination of CPU and supporting logic. A memory 102a can be provided to store any needed computer executable program code and data that may be needed by the controller 102. The memory 102a may be any suitable technology for storing such information and may include volatile memory such as random access memory (RAM), non-volatile memory such as flash memory, mass storage memory such as disk drive storage, and so on. The memory 102a can comprise any one or a combination of these memory technologies.

A display device 104 may be provided to allow a user to interact with the laser diode driver 100. Operational information can be conveyed to the user via the display device 104. In an embodiment, the display device 104 may be a touch sensitive device, allowing the user to input various information, settings, control commands, and so on to the instrument 100. In embodiments, the display device 104 may include various kinds of visual or audio information such as blinking lights, beeping tones, and so forth.

A communication interface 106 may be provided to allow a user to connect an external device to the laser diode driver 100. For example, the interface 106 may be suitable for connection with an external computer to allow such external computer to control operation of the instrument 100 or interrogate the instrument.

An internal bus 118 can provide internal data bus and control bus interconnections among the components that comprise the laser diode driver 100. For example, digital data may be received via the communication interface 106 and transmitted over the bus 118 to controller 102. The controller 102 may produce digital and/or analog control signals that are used to control the current sources 112, 114.

In embodiments of the present invention, the laser diode driver 100 may include a pulsed bias current source 112 and a main drive current source 114. The pulsed bias current source 112 is a current generator that can generate and produce at its output a current that can be referred to herein as the "pulsed bias current" or the "bias current." The main drive current source 114 is a current generator that can generate and produce at its output a current that can be referred to herein as the "main drive current" or the "drive current." In embodiments, the controller 102 can generate suitable control signals to control the operation of the pulsed bias current source 112 and the main drive current source 114.

The outputs of the pulsed bias current source 112 and the main drive current source 114 can be combined by a suitable combining circuit 116 to produce an output current that is the sum of the bias current and the drive current. The output of the combining circuit 116 drives an output terminal 132 of the instrument 100 with its output current to produce an instrument output current that appears at the output terminal. The laser diode subsystem 142 can be driven by the instrument output current by a suitable connection to the laser diode subsystem to the output terminal 132.

Figure 2:
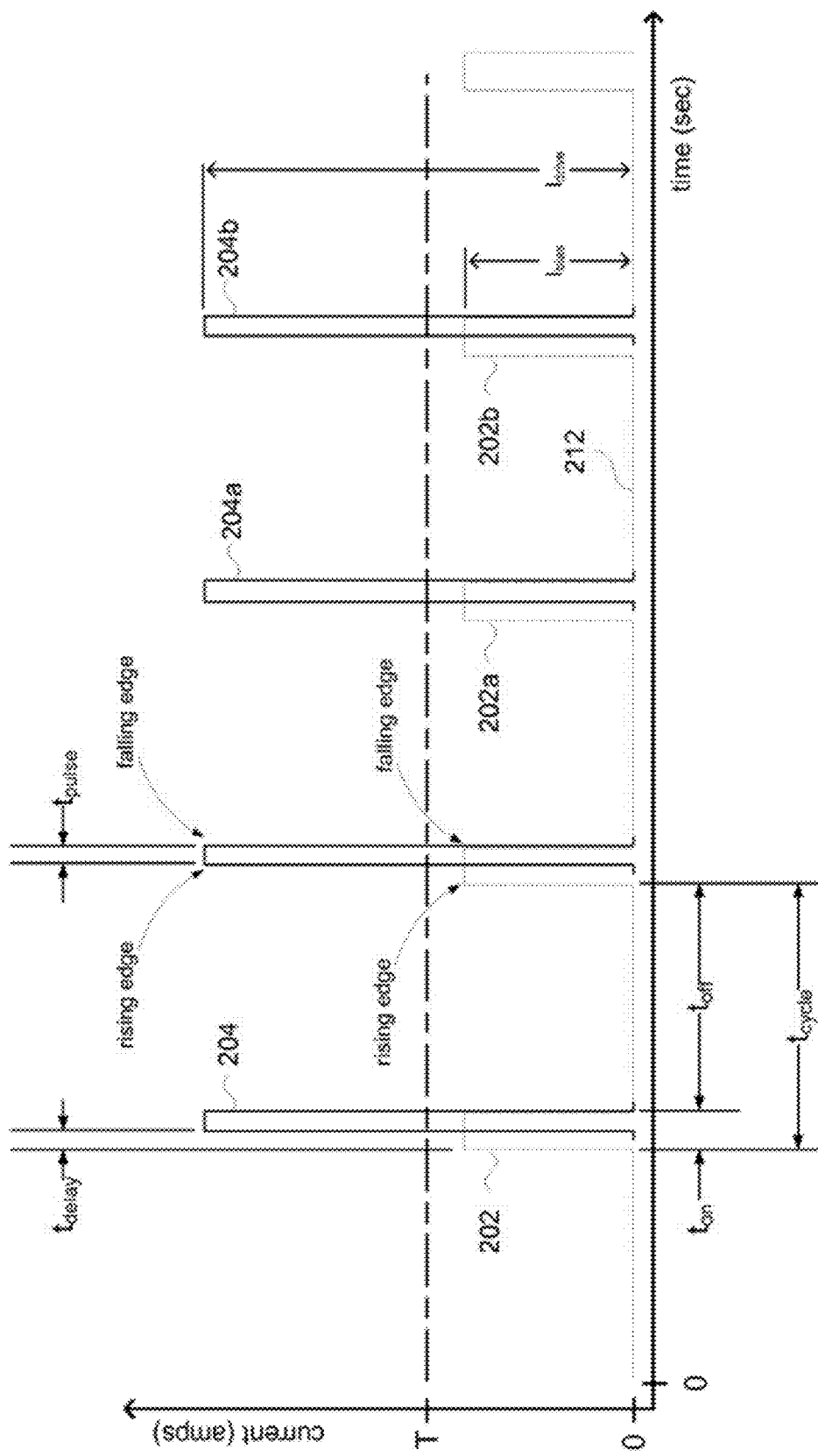
FIGS. 2 and 2A show current waveforms in accordance with embodiments of the present invention.

In embodiments of the present invention, the pulsed bias current source 112 can be operated/controlled by the controller 102 to produce a pulse width modulated (PWM) current signal at its output. Referring for a moment to FIG. 2, a waveform 212 represents a PWM current signal that can be generated by the pulsed bias current source 112. The waveform 212 represents a continuous PWM current signal (comprising pulses 202a, 202b) having a duty cycle that is established by the $t_{on}$ and $t_{cycle}$ parameters, namely duty cycle (expressed as percent) equals $t_{on}/t_{cycle} \times 100$, where $t_{on}$ is the pulse width (ON time of the pulse) and $t_{cycle}$ is the period of the PWM current signal. In embodiments of the present invention, the duty cycle can be less than 100%; i.e., $t_{on}<t_{cycle}$. In embodiments of the present invention, the duty cycle can be greater than 0%; i.e., $t_{on}>0$. In embodiments of the present invention, the duty cycle can be equal to 100%; i.e., $t_{on}=t_{cycle}$. These parameters can be obtained from a data stored in the memory 102a, or received from a user (for example, via interface 106). In embodiments, an external trigger signal can be used, as will be explained in further detail below.

Further in accordance with embodiments of the present invention, the amplitude $I_{bias}$ of the PWM current signal 212 is less that the current level T, namely the turn-on threshold current level of the laser diode 142 above which the laser diode will turn on. Accordingly, if the laser diode 142 is driven by the PWM signal 212, the laser diode will not turn on.

Returning to FIG. 1, the laser diode driver 100 may include a main current source 114 that can produce the main drive current for turning on the laser diode 142 under control/operation of the controller 102. As shown in FIG. 2, the main current source 114 can be operated to generate a series of drive current pulses 204a, 204b. Each drive current pulse 204 can have am amplitude $I_{drive}$ and a pulse width of $t_{pulse}$ units of time. In embodiments, the controller 102 can control the output of the drive current pulses 204a, 204b to coincide with the PWM signal 212 in accordance with the present invention. In particular, the onset of a drive current pulse 204 is delayed relative to the rising edge of a PWM pulse 202 by an amount of time $t_{delay}$. The time delay value $t_{delay}$ can be obtained from information stored in the memory 102a, or received from a user.

Returning to FIG. 1, in embodiments of the present invention, the current sources 112, 114 can be triggered by external sources instead of by control of the controller 102. A trigger input 134 can be provided for the pulsed bias current source 112. A trigger source 152 can be connected to the trigger input 134 to provide a suitable trigger signal to the pulsed bias current source 112 to generate a pulsed bias current. For example, in an embodiment, the waveform 202 shown in FIG. 2 can be generated by a trigger signal originating from trigger source 152 that is applied to the trigger input 134.

Likewise, a trigger input 136 can be provided for the main current source 114. A trigger source 154 can be connected to the trigger input 136 to provide a suitable trigger signal to the pulsed bias current source 114 to generate a drive current pulse. For example, in an embodiment, the pulses 204a, 204b shown in FIG. 2 can be generated by a trigger signal originating from trigger source 154 that is applied to the trigger input 136.

Referring again to FIG. 2, it is observed that the falling edges of the pulsed bias current 202 and of the drive current pulse 204 occur substantially at the same time. While it may be typical that the falling edge of the pulsed bias current 202 coincides with the falling edge of the drive current pulse 204, it will be appreciated that the falling edges of the pulsed bias current 202 and of the drive current pulse 204 need not occur at the same time. In an embodiment, the falling edge of the pulsed bias current 202 may occur earlier in time than the falling edge of the drive current pulse 204. In an embodiment, the falling edge of the drive current pulse 204 may occur earlier in time than the falling edge of the pulsed bias current 202.

It is understood that the waveform representations in FIG. 2 are schematic. Actual waveforms will have a finite rise time at their leading edges. Likewise, actual waveforms will have a finite fall time at their trailing edges. Such specific details can be ignored for the purposes of explaining the present invention.

Figure 2A:
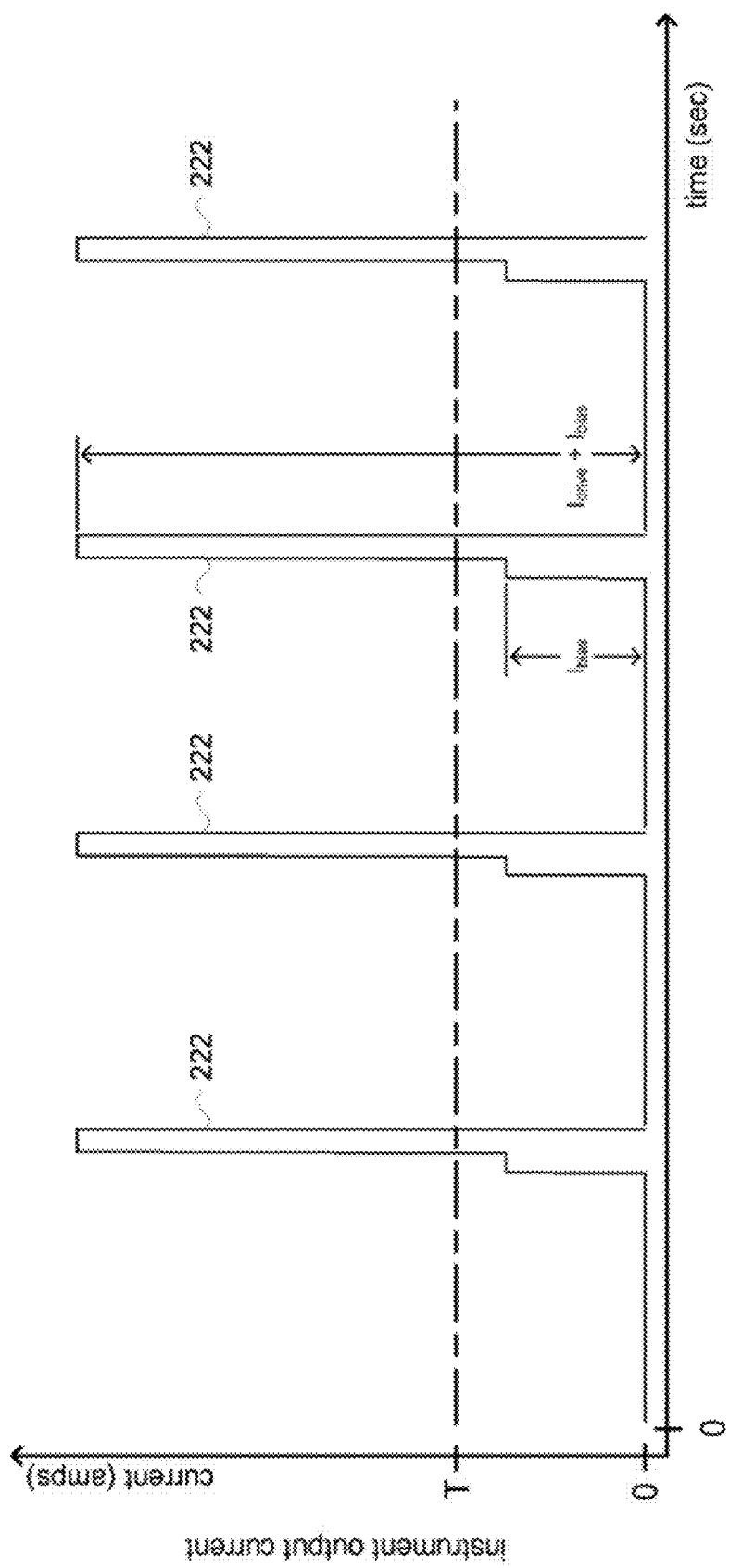

FIG. 2A illustrates an example of waveforms 222 that can drive the output terminal 132 of the laser diode driver 100. Each waveform 222 represents the sum of the pulsed bias currents 202a, 202b and the drive current pulses 204a, 204b. The pulsed bias currents 202a, 202b contribute to the shoulder portion of each waveform 222 and has an amplitude of $I_{bias}$ less than the turn-on threshold current T of the laser diode. Accordingly, the laser diode remains dark. When the pulsed bias currents 202a, 202b sum with the drive current pulses 204a, 204b the current at the output terminal 132 jumps to a level $I_{bias}+I_{drive}$ which is greater than the turn-on threshold current T, causing the laser diode to instantly turn on by virtue of having been pre-driven by the pulsed bias current pulses. It will be noted that $I_{drive}$ can be any value greater than or equal to $T-I_{bias}$.

Figure 3:
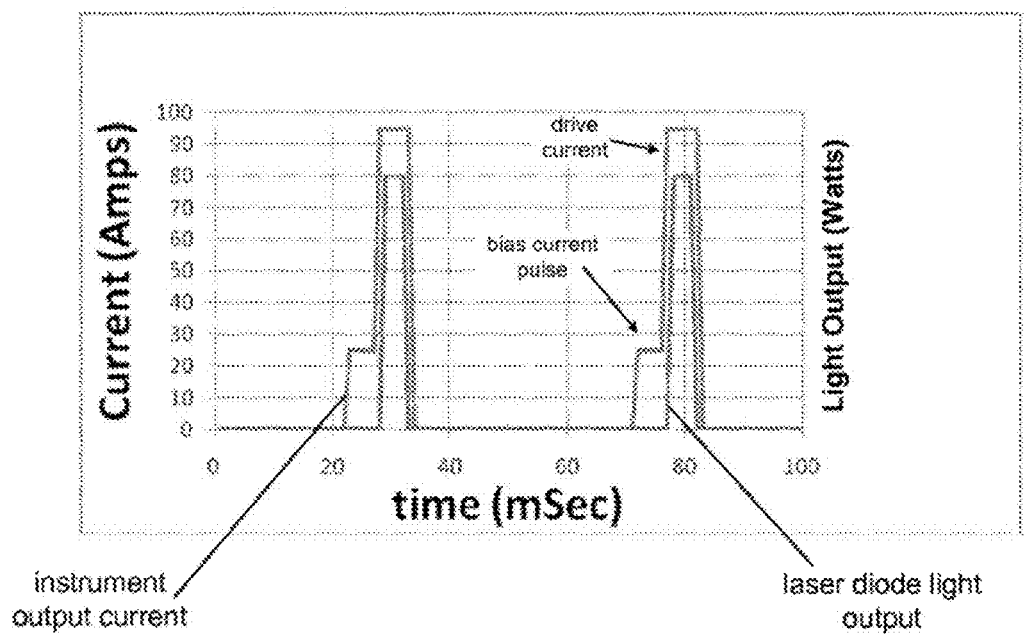
FIG. 3 shows traces of instrument output current and light output in an embodiment of the present invention.
Figure 13:
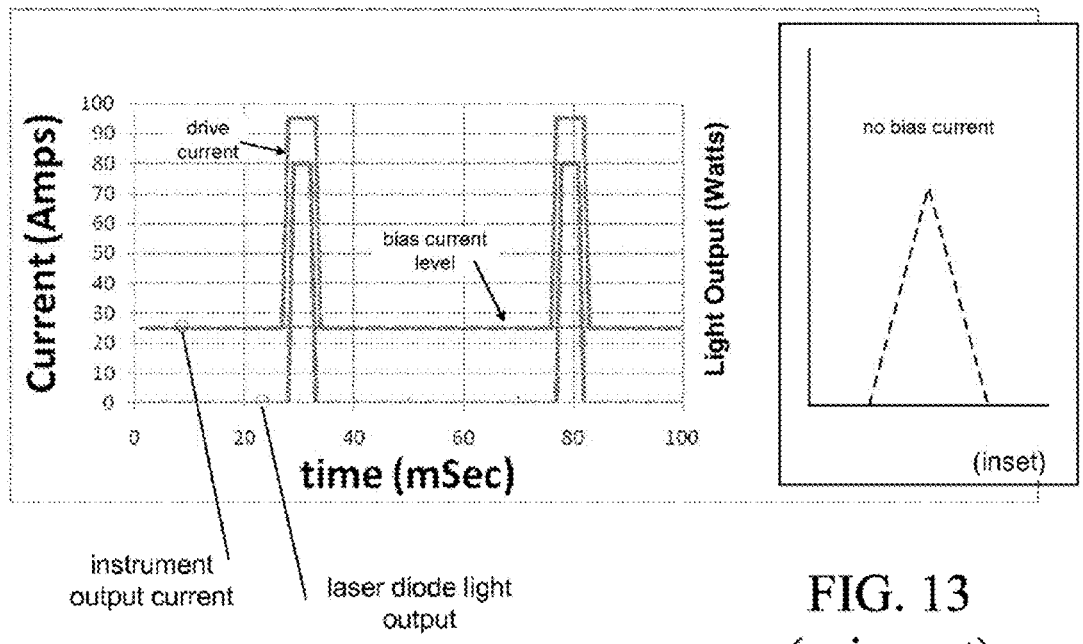
FIG. 13 illustrates bias current in a conventional laser diode driver.

FIG. 3 shows traces for the instrument output current produced at output terminal 132 superimposed with the light output of the laser diode 142, in accordance with the present invention. The figure shows the waveform for the instrument output current, showing contributions of the pulsed bias current (e.g., 212, FIG. 2) component and the drive current pulse (e.g., 204, FIG. 2) component of the instrument output current. FIG. 3 dramatically illustrates that a laser diode can be driven by a bias current in accordance with embodiments of the present invention for a significantly shorter time as compared to conventional biasing procedures (such as illustrated in FIG. 13). Embodiments of the present invention thus offer numerous benefits including reduced "wear and tear" on the electronics (for example, because they are subjected to high current for shorter periods of time), less heat generated on the output cable and in the laser diode device, lower operating costs (for example, due to lower power requirements from the power utilities), and so on.

Figure 3A:
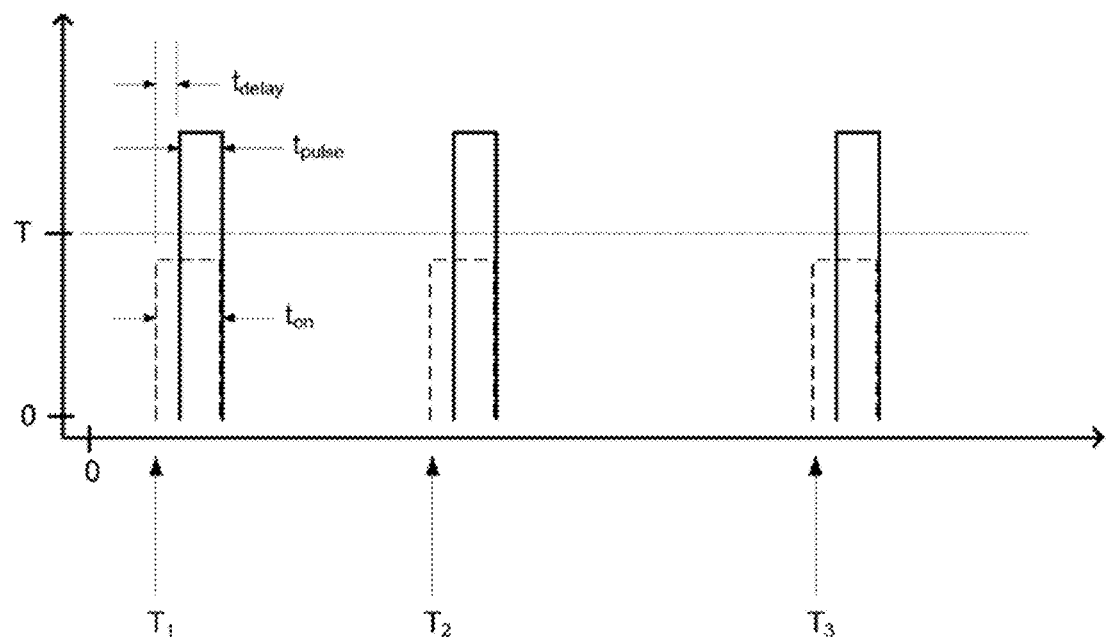
FIG. 3A illustrates waveforms for a triggered operation.

The foregoing has explained operation of the laser diode driver 100 in a mode where the instrument output current drives the laser diode 142 with a periodic signal (e.g., FIGS. 2 and 4) to produce a periodic series of laser bursts. Referring to FIG. 3A, it will be appreciated that the laser diode driver 100 can be operated in a "single shot" (triggered) mode, wherein a trigger signal can be used to generate a single laser burst. For example, the user can trigger a single shot via the interface 122 to signal the controller 102 to generate single burst of output current at the output terminal 132.

FIG. 3A illustrates this single shot (or single burst) mode of operation in accordance with embodiments of the present invention. As explained above, the various timing parameters can be determined using the foregoing calibration sequence, including the ON time $t_{on}$ and amplitude of the pulsed bias current (represented in dashed lines), the pulse width $t_{pulse}$ of the drive current pulse (represented in solid lines), and the delay time $t_{delay}$ which designates the delay of the onset of the drive current pulse with respect to the pulsed bias current. The figure illustrates, for example, instances in time where a user has decided to trigger bursts of laser, at aperiodic times $T_1$, $T_2$, and $T_3$.

Referring now to FIGS. 4 and 5A-5E, a calibration procedure for adjusting the bias current in accordance with an embodiment of the present invention will be explained. FIG. 4 shows steps of the process, and FIGS. 5A-5E illustrate current waveforms during the calibration. The procedure illustrated in FIG. 4 may be performed by the user under the direction of controller 102 executing suitable program code stored in memory 102a. Thus, in a step 402, the pulsed bias current source 112 can be operated to output current at 100% duty cycle, i.e., a constant current output. At this initial step, the initial current level output by the pulsed bias current source 112 may be set to a very low current level such that the laser diode 142 remains dark. Step 402 is illustrated in FIG. 5A by a constant current waveform of the output of the pulsed bias current source 112.

In a step 404, the current level of the output current of the pulsed bias current source 112 can be increased gradually until it reaches the turn-on threshold current level T, where the laser diode turns on. The current level can then be reduced to a level less that T, where the laser diode goes dark. This step can be fully automated by the controller 102, where the user simply informs the system 100 (e.g., via input on the touch screen, or the like) that the laser diode has turned on, and then has gone dark. Alternatively, this user can directly control the current level. FIG. 5B illustrates the current level of the output current of the pulsed bias current source 112 being set to a level below the threshold level T.

In a step 406, the duty cycle of the pulsed bias current source 112 can be reduced from 100%. The initiation of this step is illustrated in FIG. 5C, where the duty cycle $D_1$ has been reduced from 100%. In the meanwhile, the main drive current source 114 is operated to output drive current pulses, indicated in FIG. 5C by the solid line waveforms. This will turn on the laser diode 142, and since the laser diode is being driven by the pulsed bias current source 112, the light output of the laser diode should have the desired characteristic, as illustrated for example by the light output traces in FIGS. 4 and 13. It is noted that the pulse width of the drive current pulses can be specified by the user.

In a step 408, the duty cycle can be further reduced until the light output of the laser diode 142 no longer exhibits the desired characteristic. FIG. 5D illustrates an example of this situation where the duty cycle of the pulsed bias current has been reduced to $D_2$ ($<D_1$). At this point, the duty cycle can be increased again, say to a value $D_3$ ($>D_2$), where the light output of the laser diode 142 once again exhibits the desired characteristic, as illustrated for example in FIG. 5E. At this point the laser diode driver 100 can be considered to be calibrated and ready for use. The settings (e.g., pulsed bias current amplitude, $t_{on}$, $t_{pulse}$, and $t_{delay}$) can be stored in the memory 102a.

Figure 6:
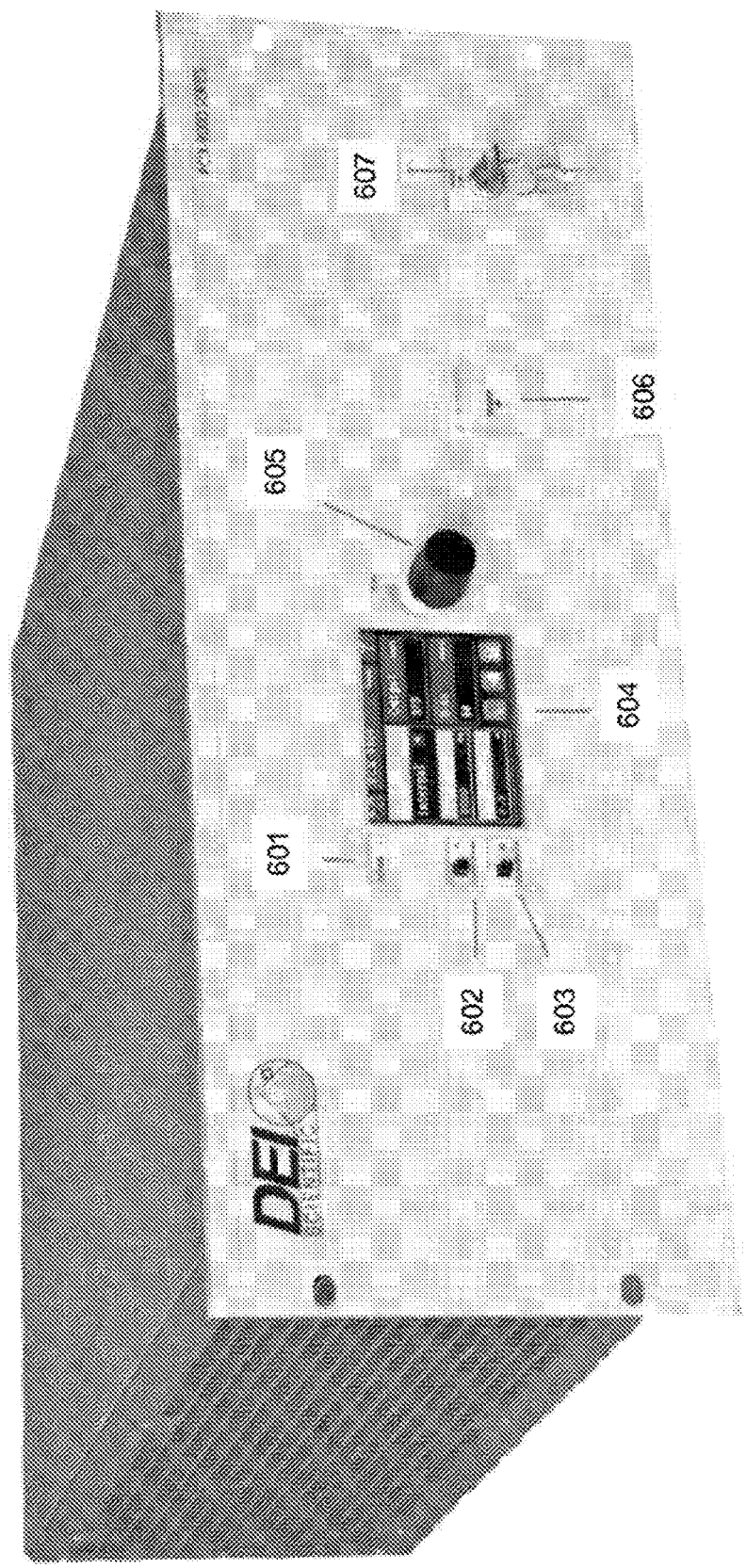
FIG. 6 is a photograph of a front panel of a PCX-9000 series instrument embodied in accordance with the present invention.
Figure 7:
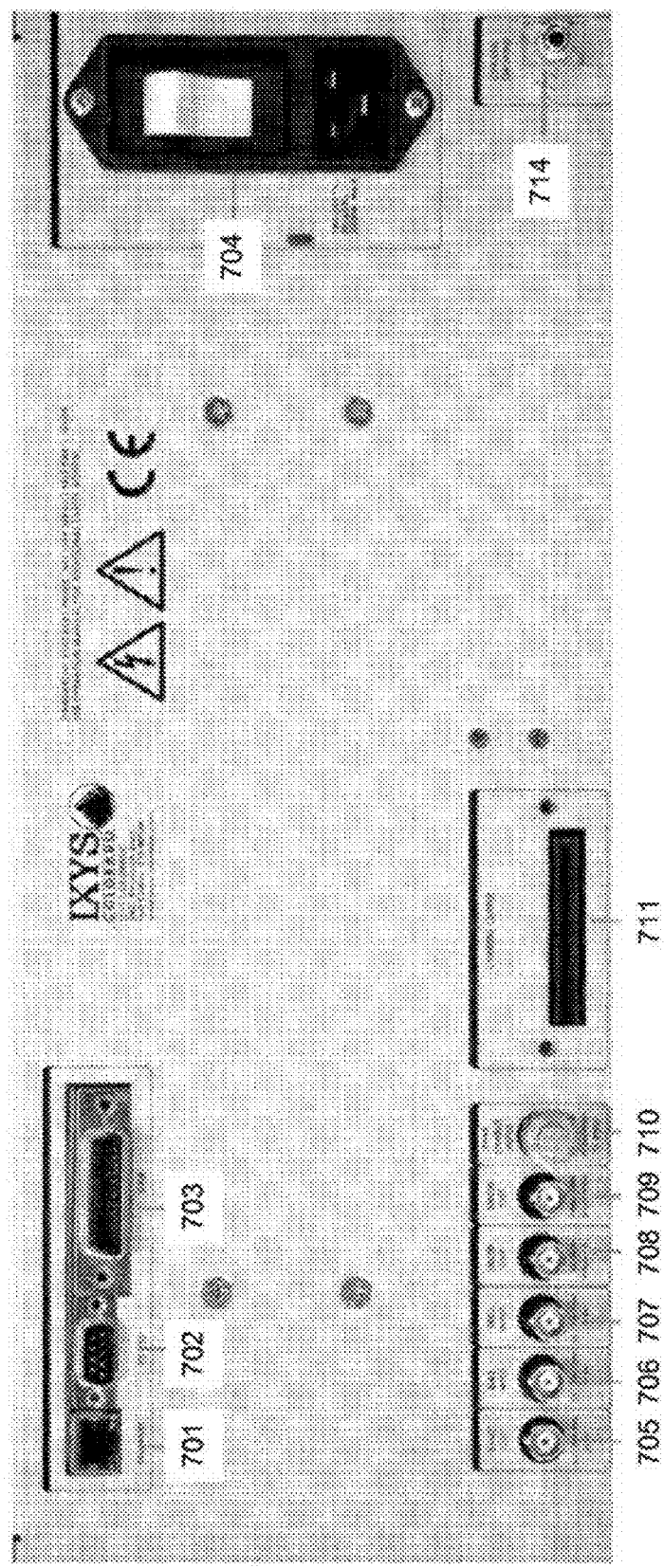
FIGS. 7 and 8 are photographs of rear panels of different versions of the PCX-9000 series instrument.
Figure 8:
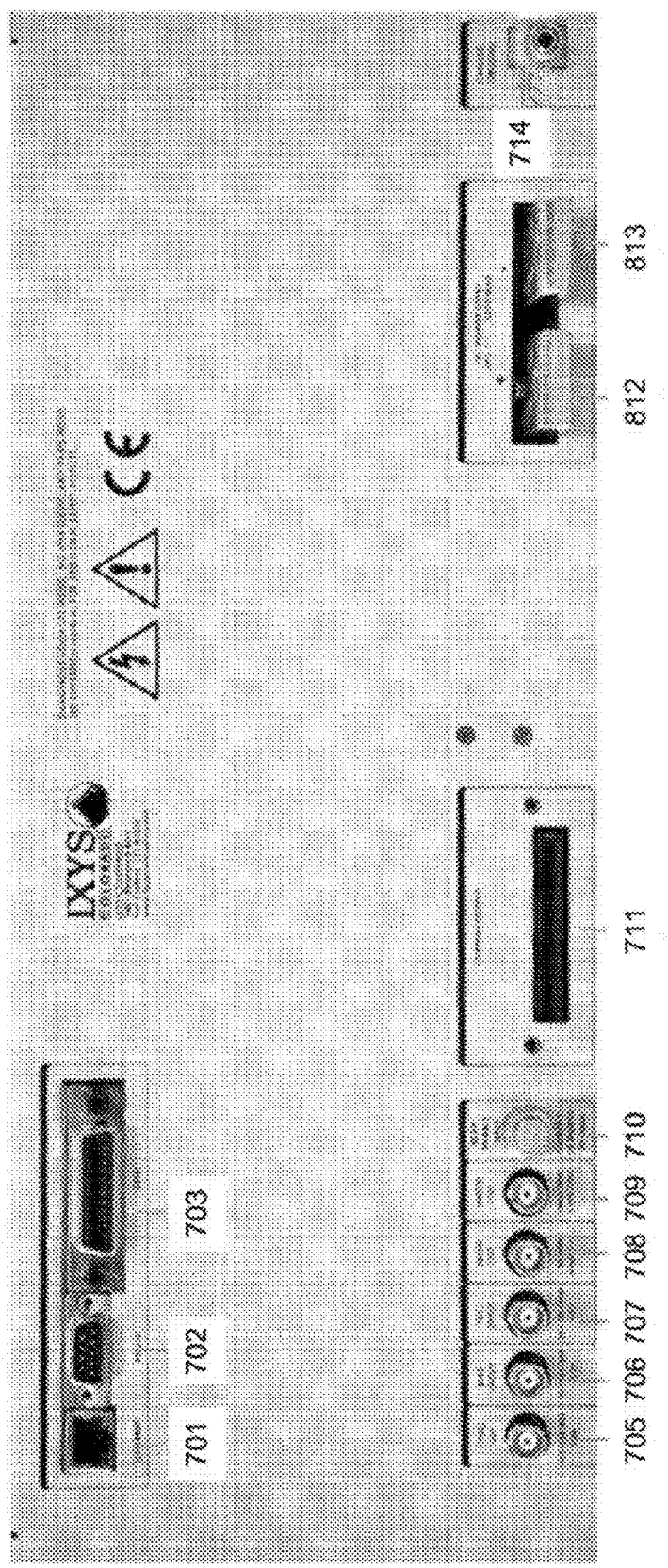

An embodiment of a laser diode driver in accordance with the present invention is shown in the photographs presented in FIGS. 6-8. The instrument shown in the photographs is referred to as a PCX-9000 Series instrument, and is manufactured and sold by the assignee. The PCX-9000 instrument is a pulsed current source designed to drive laser diode bars and arrays requiring current of up to 600 Amps at 24 Volts. The PCX-9000 instrument is available in three different configurations, PCX-9200, PCX-9400, and PCX-9600, which can drive the output up to 200 Amps, 400 Amps, and 600 Amps respectively. All three configurations are capable of supplying a bias current of up to 60 Amps. Submitted herewith in an Appendix is a user's manual for the PCX-9000 instrument and is incorporated herein in its entirety for all purposes. Following is a description of aspects of the PCX-9000 instrument.

FIG. 6 is a photograph of the front panel of the PCX-9000 instrument, which includes:

Power LED, 601
The Power LED is a green LED that turns on when there is power present in the system.

Output Enable Switch, 602
The Output Enable Switch toggles between enabling and disabling of the output 711 (FIG. 7), and is used to enable and disable pulses. There is an LED to the right of this button. Red indicates the output is disabled, green indicates the output is enabled.

The Output Enable Switch may be used regardless of which screen is displayed on the LCD display 604. The function of pressing this button changes depending on the trigger mode. If the unit is in an internal trigger mode, pressing this button will enable or disable pulses at the frequency the unit is programmed to. The pulse will continue until the button is pressed again or a fault has occurred. In external trigger mode, output pulses will occur when the unit is triggered from the TRIGGER INPUT, 707 (FIG. 7), BNC connector.

Local/Remote Switch, 603
The Local/Remote Switch is used to change from remote control to local front panel control of the instrument. The Local/Remote Switch switches the system between Remote control (e.g., operation via an external computer) and front panel local control.

There is an LED to the right of this button. Green indicates the instrument is in local control, the user can adjust settings with the display and/or encoder. Red indicates a computer is controlling the instrument.

The user is not allowed to update any settings when a computer is controlling it. To return to local control just press this button. The instrument will automatically switch from local control to remote control if any external communications occur; for example, as soon as a command is received from an external computer, the system automatically switches to remote mode.

LCD Display, 604
The LCD display is a color display that includes a touch screen that allows the user to navigate to various screens and update various settings by simply touching the display. While the instrument is displaying the home screen the user is able to adjust the trigger source, main output current and bias current by simply pressing on the icons. Generally, the upper left hand corner will allow the user to toggle between the Home Screen and the Settings Screen. The user is almost always a single press away from the home screen. The upper right hand corner will give the user help if it is available.

Encoder Switch, 605
The Encoder Switch allows a multiplier to be used on some numeric entries. The multiplier, if it exists, will reside on the LCD under the numeric value that is being modified. Generally, the encoder allows the user to adjust various numeric settings. A clockwise motion increases a setting and a counter clockwise motion decreases a setting. Many settings allow the user to adjust a multiplier by simply pressing the encoder inward.

Trigger LED, 606
The Trigger LED blinks when an external or internal trigger signal is present and the output is enabled.

Figure 9:
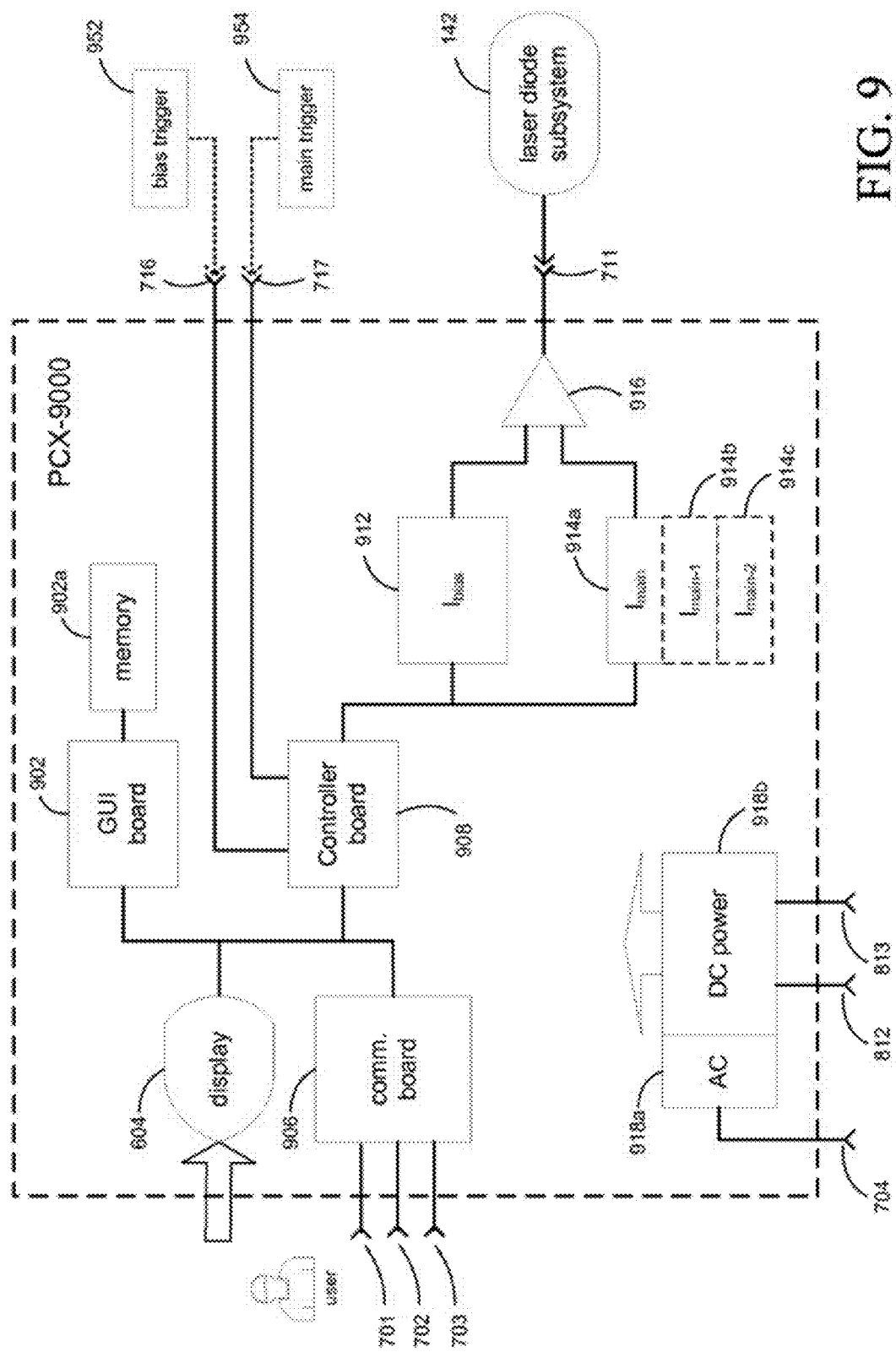
FIG. 9 is a high level block diagram of components of the PCX-9000 series instrument.

Key Switch, 607
The Key Switch is used to enable/disable current at the unit's output terminal 711. In addition to disabling the output, the Key Switch also reduces the power consumption of the instrument by disabling inductor current storage in the main current source(s) 914a-914c (FIG. 9).

It is recommended that this switch be OFF when the output is not going to be used for an extended period of time. The Home Screen on the LCD display 604 shows a key icon in the lower right hand corner: green indicates the switch is ON, red indicates it is OFF.

FIG. 7 is a photograph of the rear panel of the PCX-9000 instrument. The particular model illustrated in the figure includes an internal power supply and includes:

Ethernet connector, 701
The Ethernet connector allows the user to control the instrument with a computer using Ethernet with socket communications.

RS232 connector, 702
The RS232 connector allows the user to control the instrument with a computer using RS232.

GPIB connector, 703
The GPIB connector allows the user to control the instrument with a computer using a GPIB bus. The RS-232, GPIB, and Ethernet connectors can be used for remote control by an external host computer. Remote mode operation is designed for this ability. This feature allows the user to create system level control software to run standardized test procedures for research test or manufacturing validation environments.

AC Mains power connector, 704
The AC Mains power connector allows the user to power the instrument with the provided power cord. This connector is only present on units with an internal power supply.

SYNC OUT connector, 705
The SYNC OUT connector drives an output signal that provides a pulse that drives from 0V to 5V at the beginning of the instrument's main current output pulse and drives from 5V to 0V at the end of the output current pulse. This output can drive a 50 Ohm terminated cable.

BIAS INPUT connector, 706
The BIAS INPUT connector receives an input trigger signal for the Bias output. This input is only used with external trigger, it gives the user the ability to trigger the Bias Output as required. Connect to 5 Vdc if a Bias Output is required to run at 100% duty cycle. The user can also pulse this input to allow a reduced duty cycle on the Bias Output. This signal is terminated at 50 Ohm or 10$k$ Ohms which is done via the Home Screen or computer control.

TRIGGER INPUT connector, 707
The TRIGGER INPUT connector receives an input trigger signal for the Main Output Current. This input is only used with external trigger, it gives the user the ability to trigger the Main Output Current as required. A transition from 0V to 5V turns on the Main Output Current, and a transition from 5V to 0V turns off the Main Output Current. This signal is terminated at 50 Ohm or 10 k Ohms which is done via the Home Screen or computer control.

IMON connector, 708
The IMON connector drives an output signal that is representative of the actual output current being driven out of the instrument. The user should use a 50 Ohm cable terminated with a 50 Ohm terminator to get a good reading. The voltage on this node is created with the main current driving though a 454 µOhm shunt. The shunts are calibrated at the factory, and the calibration factors can be read on the Setting Screen by selecting the VMON-IMON icon. The return path, or shield of this connector, has an independent return path that should not be electrically connected to any other input or output BNC's.

VMON connector, 709

The VMON connector drives an output signal that is representative of the actual output voltage being driven out of the instrument. This output should be terminated with a 1 M Ohm terminator to get a good reading. The voltage on this node is created voltage divider that reduces the actual voltage by a factor of about 0.232. If the output voltage was 100 Volts there would be 23.2 Volts on this output. The voltage divider is calibrated at the factory, and the calibration factors can be read on the Setting Screen by selecting the VMON-IMON icon. The return path, or shield of this connector, has an independent return path that should not be electrically connected to any other input or output BNC's.

REAR ENABLE connector, 710

The REAR ENABLE connector is an input signal that allows the instrument to enable the output. The tip and ring should be shorted to enable the output. If the tip is not connected to the ring (open) then the instrument will not enable the output. This signal can be routed to the users load to disable the output if the signal is opened.

CURRENT OUTPUT connector, 711

The CURRENT OUTPUT connector is the output current driven from the instrument, both Bias and Main current output from this connector. A custom cable that is shipped with each instrument must be used for this connector, if the custom cable is not connected to this connector the instrument will not allow the output to be enabled.

CHASSIS GROUND NUT, 714

The CHASSIS GROUND NUT must be used to provide a chassis ground if an external DC supply is used. It can also be used to provide chassis ground to other instruments in the overall system, if an internal AC/DC supply is used.

FIG. 8 is a photograph of the rear panel of the PCX-9000 instrument. The particular model illustrated in the figure does not include an internal power supply. The connectors that are common to the model shown in FIG. 7 are identified by the same reference numerals. The model shown in FIG. 8 does not include an AC mains power connector since there is no internal power supply. However, the model shown in FIG. 8 includes:

POSITIVE DC POWER BUS BAR, 812

The POSITIVE DC POWER BUS BAR is the DC INPUT for the instrument, and connects to an external DC power supply.

NEGATIVE DC POWER BUS BAR, 813

The NEGATIVE DC POWER BUS BAR is the DC INPUT for the instrument, and connects to the external DC power supply.

Referring now to FIG. 9, a high level block diagram of the PCX-9000 Series instrument illustrated in FIGS. 6-8 is shown. Reference numerals from FIGS. 6-8 will be used to refer to those elements that are common among FIGS. 6-9.

The PCX-9000 includes a graphical user interface (GUI) board 902. The GUI board 902 serves as the command center for the PCX-9000. The GUI board 902 includes a microprocessor controlled board that communicates to all modules within the system. The LCD display 704 is configured with touch screen capability. The GUI board 902 receives input from the various front panel controls (FIG. 6) that enable the user to easily update all instrument settings.

A communications board 906 allows the user to use an external computer to communicate with the instrument via communication interface inputs, including the Ethernet connector 701, the RS232 connector 702, and the GPIB connector 703. The GUI board 902 is used to select which input from the communications interface input is active. Adjustments to the settings are stored into a non-volatile memory 902a so that they can be used every time the instrument is powered up. All commands and queries are received, decoded, and executed through the GUI board 902. The communications command set will be discussed below.

A controller board 908 generates outputs including $I_{mon}$, $V_{mon}$, and Sync outputs, which will be explained in further detail below. In addition to these outputs, the controller board 908 handles inputs from the front panel and rear panel elements shown in FIGS. 6-8, including the key switch 607, cable enable, rear enable 710, bias and main trigger 716, 717 inputs. With these inputs, outputs, and user commands from the GUI board 902, the controller board 908 can generate an internal clock or use the external trigger and bias signals to trigger the output of the system.

A bias current source 912 generates the bias current under control of the controller board 908. The main current is provided by one or more 200 Amp Modules 914a-914c. The 200 Amp Modules 914a-914c circulate current in inductive loops and have FET (field effect transistor) switches to direct the flow of current internally or externally to the load. Each module can deliver up to 200 Amps of current to the output with a rise time of less than 100 nSec. The PCX-9200 has one of the modules, PCX-9400 has two, and the PCX-9600 has three.

The current outputs from the bias current source 912 and the main current modules 914a-914c are combined by the combining circuit 916 to drive the instrument's output terminal 711. Due to the high current levels that the output terminal 711 must provide, the output terminal connector comprises a special cable assembly to enhance safety. The cable assembly interfaces the instrument via a Molex board edge connector and custom mechanical back shell and is connected to a stripline. The back shell of this output cable has an embedded magnet to activate a rear enable signal to prevent the output from driving without a cable installed. The top conductor is positive and the lower conductor is negative. The Positive terminal is the power output terminal which is to be connected to the Anode of the Laser Diode. The Negative terminal is the power return or ground and is to be connected to the Cathode of the Laser diode. The end of the stripline has a board edge connector, Molex #45714-0003, for the user to interface their load with a custom 0.063" thick PCBA.

In models of the PCX-9000 instrument where an internal power supply is provided, an AC converter 918a receives AC power from an external source via connector 704 and converts it to DC power 918b (voltage and current) that is provided to the other internal components of the instrument. In models of the PCX-9000 instrument where there is no internal power supply, the DC power 918b is provided from an external DC power source via the DC bus bars 812, 813.

The table shown in FIGS. 10A and 10B provide some specifications for embodiments of the PCX-9000 instrument. The specifications were measured with a low inductance stripline interconnect cable to the laser diode, less than 4 nH total inductance. In embodiments, the SYNC Output signal follows the internal or external trigger by about 5 to 15 nS. This signal coincides with the signals that start the output pulse. The SYNC Output goes from 0V to 5V as soon as the output stage starts to drive the output and falls from 5V to 0V as soon as the system turns off the output pulse. This signal can be used to run multiple systems in parallel by calibrating the external trigger pulses it account for variation in timing within PCX-9000 systems.

Figure 11A:
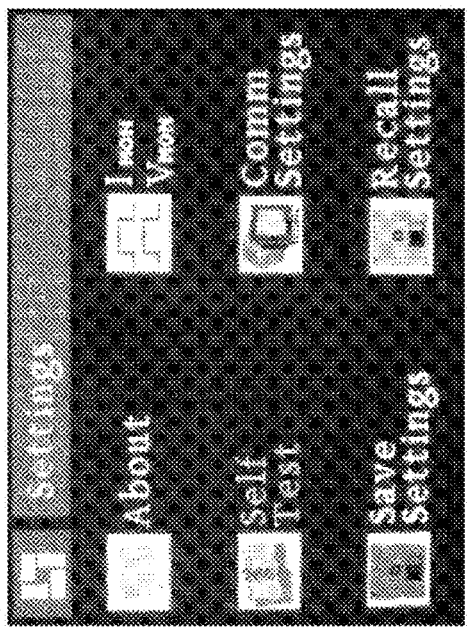
FIGS. 11A-11H show images of various UI screens displayed on the LCD display.

As explained above, the LCD display 604 has a resistive touch screen and provides the user of the instrument with the ability to set and monitor many functions of the instrument. A user interface (UI) is provided via the LCD display 604, example screen shots of which are shown in FIGS. 11A-11F. Using the touch screen 604 and encoder switch 605, the user can navigate among various the screens. For example, FIG. 11A shows a Home screen. This screen provides the user with the ability to adjust all output settings. A Settings icon, in the upper left corner depicted by the hammer and screwdriver image, will bring the user to the settings screen when it is pressed. The question mark in the upper right hand corner will show the user help on this screen as well as any screen it is displayed on. A TRIGGER icon can be selected to change between external and internal trigger mode; the figure shows external trigger mode is selected. To update either the output or bias currents, respective Output and Bias icons are provided which can be selected. The lower right three Status icons display the status of the internal temperatures, front key switch, and rear enable. A green Status icon signifies an acceptable status, red signifies an error or that the switch/input is disabled.

Figure 11B:
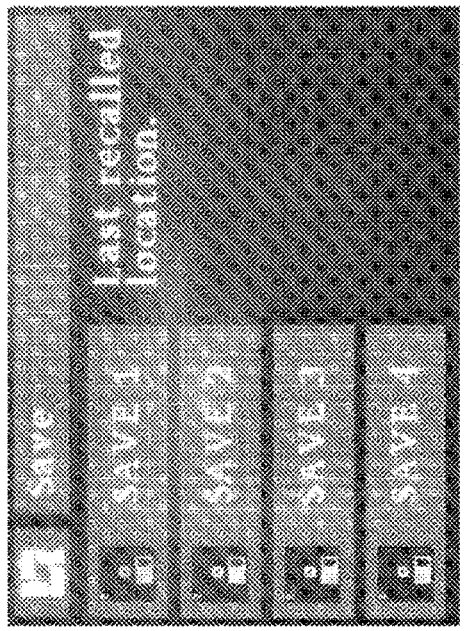

FIG. 11B shows a Settings screen. This screen provides the user with the ability to read information about the hardware and firmware. Icons are provided to allow the user to go to different screens: to see the calibration factors for IMON and VMON; adjust communication settings; and save and recall instrument settings. To access this screen from the Home screen, the user only needs to press (touch) the upper left hand corner on the Home screen. The SELF TEST icon is a feature that is not available to the user. The COMM SETTINGS icon allows the user to adjust remote communication settings.

The final two icons SAVE SETTINGS and RECALL SETTINGS, allow the instrument user to save and recall the user configurations. For user convenience the PCX-9000 has the ability to save up to four different configurations numbered 1 to 4 (FIGS. 11D, 11E). Configuration 1 is the default settings used on power up. To save or load a user configuration the user should navigate to the Settings screen, and select either the SAVE SETTINGS or RECALL SETTINGS icon. Note that these four different configurations only save output pulse information and not four unique external communications settings. There is only one external communications setting saved on the instrument, it is used for all four user configurations. Upon power up, the setting stored in "SAVE 1" is used.

To return to the Home screen from the Settings screen, the user need only press the upper left hand corner icon, the IXYS icon, on the Setting screen. Pressing the ABOUT icon, will give the user information about the systems firmware and manufactured date.

Figure 11C:
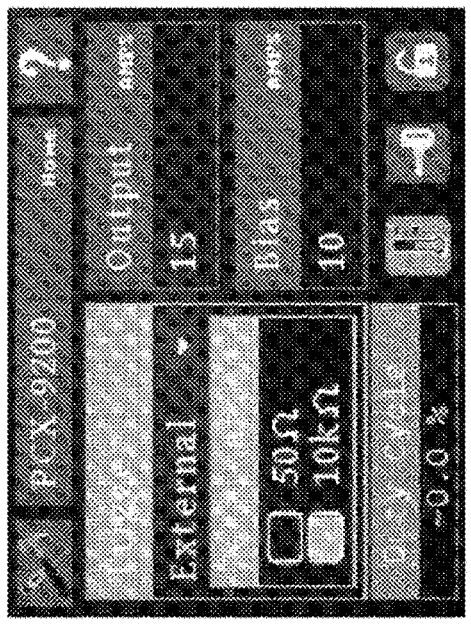
Figure 11D:
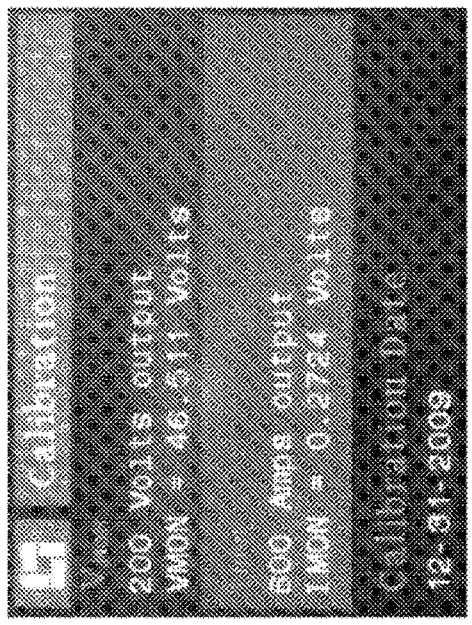

FIG. 11C shows a Calibration screen. Pressing the IMON VMON icon in the Settings screen will give the user calibration information specific to the IMON and VMON outputs of this instrument. Once on this screen, the user can press the icon in the upper left hand corner to get to the Home screen.

Figure 11F:
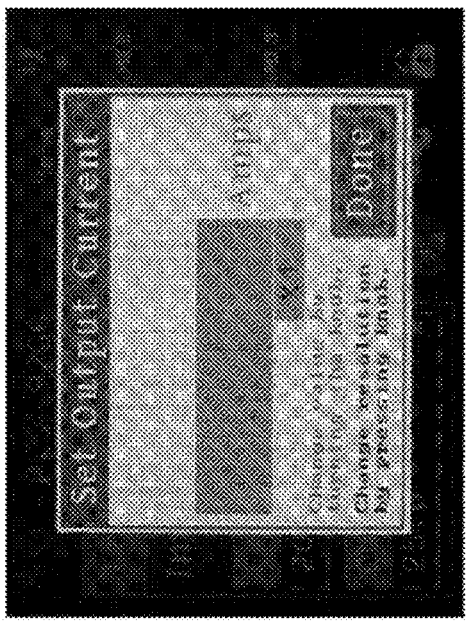

FIG. 11F is a screen used to set the main output current pulses of the PCX-9000 instrument to drive a laser diode. This screen is accessed from the Home screen. The Main Current can be adjusted between 0 Amps and 140 Amps for the PCX-9200, 0 Amps and 340 Amps for the PCX-9400, and 0 Amps and 540 Amps for the PCX-9600. To adjust this setting go to the Home screen and press anywhere in the OUTPUT icon. Once selected the screen shown in FIG. 11F will be displayed. Turn the encoder switch 605 to increase or decrease the setting. The user may also use the encoder switch 605 to change the multiplier from ×1, ×5, ×10, and ×25 by pressing it towards the front panel. Press the DONE icon on the screen shown in FIG. 11F when finished with modifying the value.

Figure 11H:
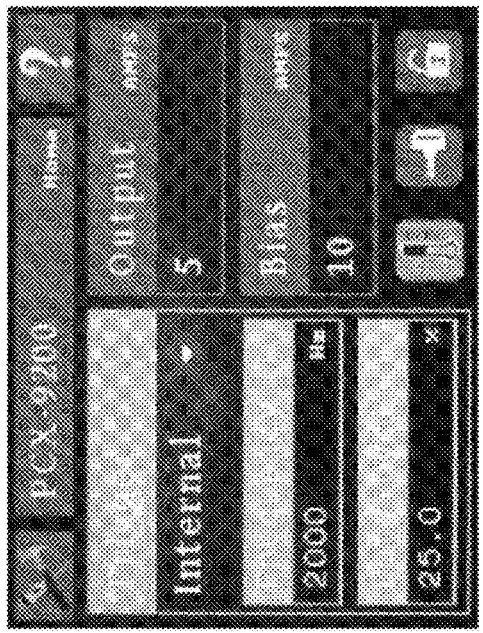
Figure 11E:
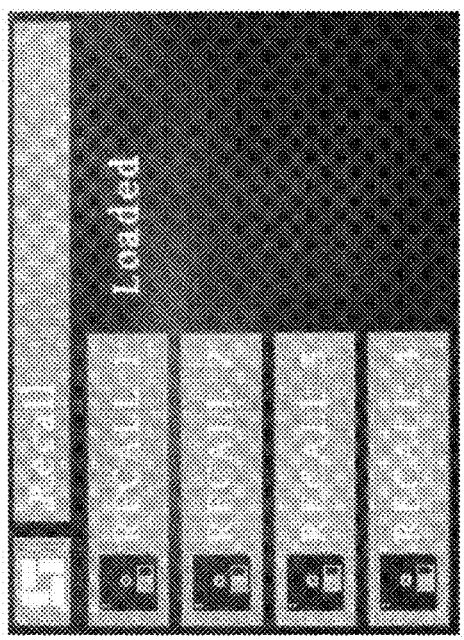
Figure 11G:
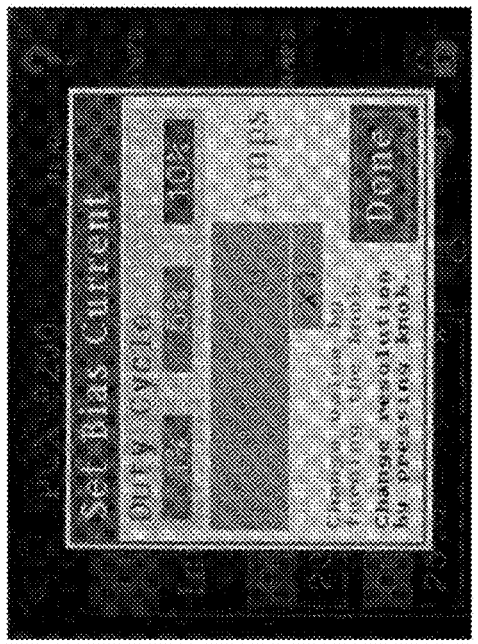

FIG. 11G shows a screen used to set the pulsed bias current. The Bias Output Current can be adjusted between 0 Amps and 60 Amps. To adjust this setting go to the Home screen and press anywhere in the BIAS icon. Once selected the screen of FIG. 11G will be displayed. Turn the encoder switch 605 to increase or decrease the setting. The user may also use the encoder switch 605 to change the current multiplier from ×1, ×5, ×10, and ×25 by pressing it towards the front panel. Press the DONE icon in FIG. 11G when finished with modifying the value.

Figure 12:
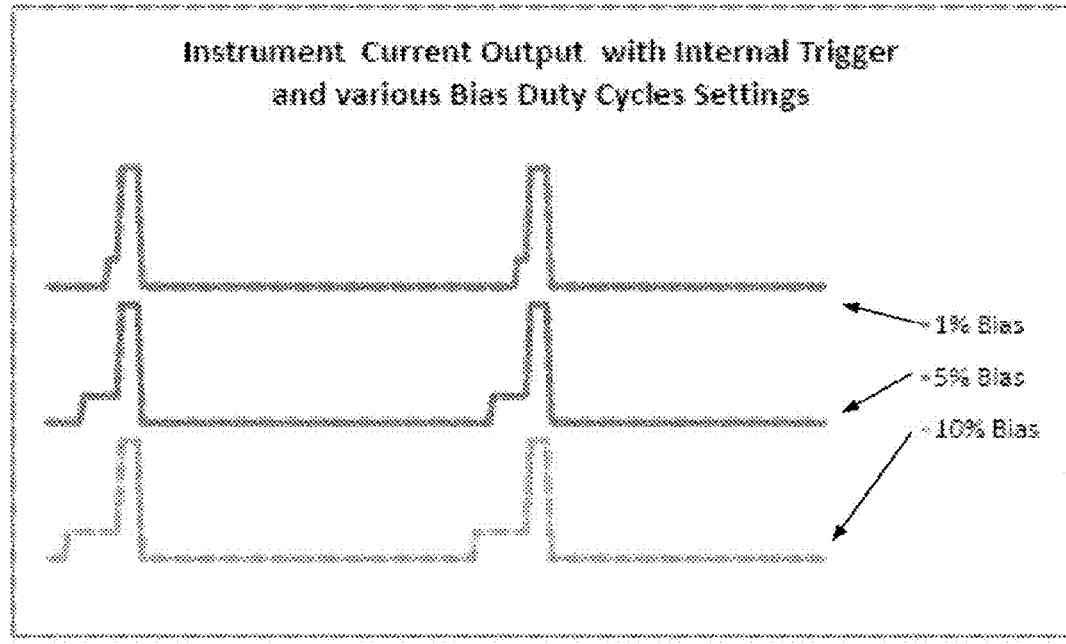
FIG. 12 show the output current of the instrument at different duty cycle settings.

With the trigger source set to internal trigger the duty cycle will be displayed on this screen also. The user may select from 1%, 5%, and 10% duty cycle by pressing the icons on this screen. FIG. 12 is a graph showing the waveforms with each duty cycle setting, the y-axis is current and the x-axis is time. The graph assumes that the main current is set to 200 Amps, Bias Current to 60 Amps, internal trigger being used with 5% duty cycle on the main current output.

With the trigger source set to external trigger, the user can trigger the bias output at any duty cycle between 0 and 100%, independent of the main trigger. If the unit is not given a Bias Trigger signal, the bias current will be output at the same time the main current is output.

FIG. 11H shows a image of the Home screen where an internal trigger is selected. The PCX-9000 instruments support internal and external trigger. The internal trigger can produce an output frequency between 2 kHz and 25 kHz with 100 Hz resolution. Pulsewidth can be adjusted between 0.1% duty cycle to 90.0% duty cycle. To select the internal trigger, the user can press the TRIGGER drop down menu from the Home screen. The display will update to display a FREQUENCY icon and a DUTY CYCLE icon.

To adjust the frequency, the user can press the FREQUENCY icon and update its value with the encoder switch 605. The user may also use the encoder switch 605 to change the frequency multiplier from ×100, ×500, and ×1000 Hz by pressing it towards the front panel. Press the DONE icon when finished with modifying the value.

To adjust the pulsewidth, the user can press the DUTY CYCLE icon and update its value with the encoder. The user may also use the encoder switch by pressing it towards the front panel to change the duty cycle multiplier from ×0.1%, ×0.5%, ×1.0%, and ×10.0%. Press 'Done' when finished with modifying the value.

An external Trigger can be selected from the TRIGGER drop down menu. The Home Screen image in FIG. 11A shows the external trigger mode having been selected. When external trigger is selected, the Home screen displays a TERMINATION icon. The TERMINATION icon can be used to set the input termination of the trigger signals. The input termination can be set to 10 kOhm or 50 Ohm. Note that this setting changes the input impedance of both the Bias and Trigger inputs. The DUTY CYCLE that is displayed below the TERMINATION icon is actually calculated by the instrument. The duty cycle that is display is used to assure that the system isn't exceeding its output rating.

What is claimed is:

1. A laser diode driver comprising:
a first current source configured to generate one or more bias current pulses;
a second current source configured to generate one or more drive current pulses;
a controller configured to operate the first current source to generate a first bias current pulse and to operate the second current source to generate a first drive current pulse; and
a summer having inputs to receive the one or more bias current pulses and the one or more drive current pulses, and having an output terminal configured for connection to a laser diode, the summer configured to drive the output terminal with an output current that is the sum of the bias current pulses and the drive current pulses, wherein the first drive current pulse has a rising edge that is delayed in time relative to a rising edge of the first bias current pulse by the time period $T_{DELAY}$, wherein a current level of the bias current pulses is less than a turn-on current threshold of the laser diode, and wherein the laser diode turns on in response to the sum of the bias current pulses and the drive current pulses exceeding the turn-on current threshold.

2. The laser diode driver of claim 1, wherein the first drive current pulse has a falling edge that coincides with a falling edge of the first bias current pulse.

3. The laser diode driver of claim 1, further comprising:
a trigger input for receiving a trigger signal from a source external to the device, wherein the controller generates the first bias current pulse in response to receiving the trigger signal.

4. The laser diode driver of claim 1, further comprising:
a trigger input for receiving a trigger signal from a source external to the device, wherein the controller generates the first drive current pulse in response to receiving the trigger signal.

5. The laser diode driver of claim 1, wherein the one or more bias current pulses forms a pulse width modulated (PWM) signal, and wherein the PWM signal has a duty cycle less that is less than 100%.

6. The laser diode driver of claim 1, wherein the controller is configured to operate the first current source and the second current source such that each of the one or more bias current pulses is synchronized with respect to each of the one or more drive current pulses.

7. The laser diode driver of claim 1, wherein a pulsewidth of the first drive current pulse is less than a pulsewidth of the first bias current pulse.

8. The laser diode driver of claim 1, wherein the laser diode driver causes the laser diode to turn on in response to a rising edge of the first drive current pulse.

9. A device comprising:
a first current source;
a second current source;
a controller configured to operate the first current source to generate a bias current pulse, wherein the controller is also configured to operate the second current source to generate a drive current pulse;
an output terminal coupled to a laser diode, wherein the bias current pulse generated by the first current source has a current level that is below a turn-on threshold current of the laser diode;
a combining circuit that is coupled to receive the bias current pulse and the drive current pulse and to generate a laser diode driver output current, wherein the combining circuit supplies the laser diode driver output current onto the output terminal, and wherein laser diode driver output current has a current level that is above a turn-on threshold current of the laser diode; and
an input terminal that receives a trigger signal, wherein in response to receiving the trigger signal, the controller causes the first current source to generate the bias current pulse and causes the second current source to generate the drive current pulse a time period $T_{DELAY}$ after the bias current pulse is generated.

10. The device of claim 9, wherein the drive current pulse has a falling edge that coincides with a falling edge of the bias current pulse.

11. The device of claim 9, wherein a pulsewidth of the drive current pulse is less than a pulsewidth of the bias current pulse.

12. The device of claim 9, wherein the time period $T_{DELAY}$ is less than twenty milliseconds.

13. The device of claim 9, wherein the device causes the laser diode to turn on in response to the combining circuit supplying the laser diode driver output current onto the output terminal.

14. A laser diode driver comprising:
a first current source configured to generate one or more bias current pulses;
a second current source configured to generate one or more drive current pulses;
a controller configured to operate the first current source to generate a first bias current pulse and to operate the second current source to generate a first drive current pulse; and
means for receiving the one or more bias current pulses and the one or more drive current pulses and for outputting an output current onto a laser diode, wherein the output current is the sum of the bias current pulses and the drive current pulses, wherein the first drive current pulse has a rising edge that is delayed in time relative to a rising edge of the first bias current pulse by the time period $T_{DELAY}$, wherein a current level of the bias current pulses is less than a turn-on current threshold of the laser diode, and wherein the sum of the bias current pulses and the drive current pulses exceeding the turn-on current threshold causes the laser diode to turn on.

15. The laser diode driver of claim 14, wherein the first drive current pulse has a falling edge that coincides with a falling edge of the first bias current pulse.

16. The laser diode driver of claim 14, further comprising:
a trigger input for receiving a trigger signal from a source external to the device, wherein the controller generates the first bias current pulse in response to receiving the trigger signal.

17. The laser diode driver of claim 14, further comprising:
a trigger input for receiving a trigger signal from a source external to the device, wherein the controller generates the first drive current pulse in response to receiving the trigger signal.

18. The laser diode driver of claim 14, wherein the one or more bias current pulses forms a pulse width modulated (PWM) signal, and wherein the PWM signal has a duty cycle less that is less than 100%.

19. The laser diode driver of claim 14, wherein the controller is configured to operate the first current source and the second current source such that each of the one or more bias current pulses is synchronized with respect to each of the one or more drive current pulses.

20. The laser diode driver of claim 14, wherein the laser diode driver causes the laser diode to turn on in response to a rising edge of the first drive current pulse.

\* \* \* \* \*